United States Patent [19]
Lin

[11] Patent Number: 5,420,506
[45] Date of Patent: May 30, 1995

[54] APPARATUS AND METHOD FOR TESTING PACKAGED INTEGRATED CIRCUITS

[75] Inventor: Chao-Hui Lin, Taichung, Taiwan, Prov. of China

[73] Assignee: Industrial Technology Research Institute, Hsinchu, Taiwan, Prov. of China

[21] Appl. No.: 79,623

[22] Filed: Jun. 18, 1993

[51] Int. Cl.$^6$ .................................................. G01R 1/04
[52] U.S. Cl. .................................. 324/158.1; 324/758; 324/754; 333/247
[58] Field of Search ................. 324/158 F, 158.1, 758, 324/754; 333/247, 254, 250; 439/70, 71, 263, 264, 269

[56] References Cited

U.S. PATENT DOCUMENTS

| | | | |
|---|---|---|---|
| 4,365,195 | 12/1982 | Stegens | 324/754 |
| 4,535,307 | 8/1985 | Tsukii | 333/247 |
| 4,538,124 | 8/1985 | Morrison | 333/247 |
| 4,912,402 | 3/1990 | Angelucci | 324/754 |
| 4,980,636 | 12/1990 | Romanofsky | 324/754 |
| 5,177,528 | 1/1993 | Koromegawa | 324/158 F |
| 5,198,754 | 3/1993 | Binet | 324/158 F |

*Primary Examiner*—Kenneth A. Wieder
*Assistant Examiner*—Mark Wardas
*Attorney, Agent, or Firm*—Bo-In Lin

[57] ABSTRACT

The present invention discloses an apparatus for testing an integrated circuit (IC) chip having a plurality of testing ports, each of the testing ports being used for connection with an testing interface assembly for further connection with external testing equipment. The apparatus includes a testing platform having a top surface, the top surface includes a chip placement means for securely placing the IC chip therein. The testing platform further includes a plurality of guiding posts extending upwardly from the top surface. The testing apparatus further includes a frame-housing which has a plurality of inter-connected walls, each of the walls further has an inner surface including an inner beam attached thereon. The inner surface and the inner beam define an elongated vertical space corresponding to each of the guiding posts of the testing platform. Each of the walls near the inner beam further includes an access means which has a plurality of openings allowing access of the testing interface assembly for connecting with the testing ports on the IC chip. Each of the guiding posts further including a locking means whereby when the frame-housing sliding along the guiding posts fitting each of the elongated vertical spaces defined by the inner wall surfaces and the inner beams thus surrounding the corresponding guiding post, the locking means further securely locks the frame-housing onto the testing platform.

12 Claims, 2 Drawing Sheets

APPARATUS AND METHOD FOR TESTING PACKAGED INTEGRATED CIRCUITS

BACKGROUND OF THE INVENTION

1. Field of the Invention

This invention relates generally to an apparatus and method for testing the surface mounted modules containing integrated circuit (IC) chips. More particularly, this invention relates to a testing fixture for convenient mounting the packaged monolithic microwave integrated circuits (MMICs) thus facilitating precise testing of the packaged MMICs to improve the quality control and assurance and to increase the production throughput thus achieving higher level of productivity.

2. Description of the Prior Art

Because of recent progress made in the semiconductor technology and packaging engineering, all the circuit elements of a high frequency RF signal processor can now be incorporated in a miniaturized MMIC package. Furthermore, the demand for large quantity of MMIC packages is also increased rapidly as these miniaturized packages are being used for broader range of applications in the field of communication, signal processing and other microwave transmission applications. However, mass production of high quality monolithic microwave integrated circuits (MMICs) is still limited by the difficulty that the speed of testing these MMIC packages is very slow because such tests often involve time consuming manual processes.

Conventional testing processes involve soldering the microwave package to a testing printed circuit (PC) board whereby the ports on the package are securely connected to the appropriate testing circuits which are then mechanically locked to a set of signal measuring assemblies (SMAs) for further connecting to co-axial cables for the performance of a sequence of tests. After the tests, a set of reverse operations must be performed to disassemble the MMIC package from the SMAs and then from the testing PC board. The processes of soldering the package to the PC board and locking the soldered combination of the PC board and the MMIC package to the SMAs and then the disassembling processes are very time consuming. Furthermore, the MMIC packages are often damaged during the tests while the testing PC boards, and the SMAs are also limited by very short life cycles because of the heavy duty imposed by such assembling and disassembling procedures which must be repeated performed.

The conventional testing procedures are also limited by the fact that the accuracy of the test results is limited by the losses caused by the transition and the impedance mismatch between the MMIC package and the testing PC board. The accuracy of the testing is degraded when the impedance deviates from the matching impedance which is generally an impedance of fifty-ohms (50-$\Omega$). The transition losses also prevent the measurement results to reflect the true performance of the MMIC package.

There are on-going efforts to improve the testing fixtures and the testing processes in order to improve the testing accuracy and the speed of the tests. Hirsch et al. disclose in U.S. Pat. No. 4,897,601 entitled "Test Fixture for Integrated Circuit Chips" (Issued on Jan. 30, 1990) an MMIC test fixture wherein an MMIC chip is placed between two chip stops and onto a planar surface. These two chip stops each having a wedging surface which asserts a predetermined clamping force onto the edges of the MMIC chip thus pressing the chip into grounding contact with the testing fixture. The MMIC chip is then heated to bond with the RF and bias connection on the testing fixture while the tests are performed. After the tests are completed, the MMIC chip is removed from the bonded connections by a heating process and the clamping force is release by a leverage means on one the chip stops to remove the MMIC chip from the testing fixture.

A nondestructive testing process is disclosed by Hirsch et al. which may reduce the damage of the MMIC chip caused by the testing process by providing a predetermined clamping force. However, the operation of the chip stops still involves bolting of many threaded screws on the chip stops to the base of the test fixture. The speed of the tests are not improved due to the fact that such bolting operations are time consuming process.

Additionally, the loss incurred by the use of this testing fixture is worsened because instead of the micro-strips provided in the testing PC board, the testing fixture as disclosed has outwardly extended micro-strips across the elongated the test fixture. The additional lengths of these micro-strips may cause further deviations of the testing results in transmitting the test signals through these strips to the MMIC circuit.

Romanofsky et al. disclose in U.S. Pat. No. 4,980,636 entitled "Universal Nondestructive MM-Wave Integrated Circuit Test Fixture" (Issued on Dec. 25, 1990) an MMIC test fixture wherein bias module with spring-loaded contacts are used to electrically engage the pads on an MMIC chip carrier. The MMIC chip carrier is disposed in a recess of a base member of the testing fixture. RF energy is applied to and passed from the chip carrier by chamfered edges of ridges in the wave guide passages of two removable housings. These two removable housings are then attached to the base member containing the MMIC chip carrier by a plurality of bolts. Different types of calibration standard cards including the 'Thru', 'Delay', and 'Short' are then inserted individually to perform different functional tests.

The test fixture as disclosed by Romanofsky et al. again suffers the same limitation that time consuming process of bolting the testing modules to the base member is required. These bolting procedures must be repeated several times because there are several inserts which must be changed when a set of test with one insert is completed. The time required for testing the MMIC chips would therefore limits the productivity of such chips.

Furthermore, the testing fixture disclosed by Romanofsky et al. utilizes removable housings which have wave guide passage including chamfered edges of ridges for applying RF energy to perform the test. These ridges are uniquely designed and fabricated for testing of special chips. The shape, length, and material for making these curved ridges are not fully described and since the curvature of these ridges are frequency dependent as is indicated in the Patent, the testing fixture disclosed by Romanofsky would probably be limited in its use for specific type of MMIC chip. Since the characteristics of these ridges have to be redesigned and re-fabricated, the usefulness of the testing fixture is limited by the efforts required to make the right: kinds of testing fixture appropriate for specific type of MMIC chips. These efforts would probably involve many trial and error with ridges of different shape and curvatures before a right kind is determined. Such uncertainty and risk in design and fabricating the testing fixtures would certainly limit the application of the apparatus disclosed by Romanofsky et al.

In order to overcome the aforementioned difficulties encountered by the Romanofsky et al.'s Patent, Tektronix use a testing PC board, i.e., Tektronix's RT/Duroid board, which has many micro-strips on its testing surface. These micro-strips are formed by the thin film and etching technology which can very precisely fabricated to match the impedance of the MMIC chip. These micro-strip are connected between the test ports on the MMIC boards and the external co-axial cables to perform the test. Tektronix's technique, i.e., the TKIT14E evaluation kit, however is limited by the excessive losses including the transition loss and the loss across the micro-strips on the PC board. The results of the MMIC tests obtained by Tektronix's evaluation kit are indirect and often cannot be reproducible due to the fact that the input impedance cannot be accurately controlled. Furthermore, the usefulness of this evaluation kit is limited to testing of the MMIC package that have extended leads which can be connected to the micro-strips.

Therefore, there is still a need in the art of MMIC test to provide an apparatus and method such that the operational characteristics of a an MMIC chip in different frequency range can be precisely measured in a well controlled and reproducible manner to assure high quality of MMIC chips can be consistently produced. For the purpose of enabling mass production of these high quality MMIC chips, the apparatus and method must be reliable and simple to use such that the testing process would not become too complicate and that the time required for performing the tests can be reduced to a reasonable level whereby it would not become a bottleneck in the fabrication process.

SUMMARY OF THE PRESENT INVENTION

It is therefore an object of the present invention to provide a packaged MMIC testing apparatus and method to overcome the aforementioned difficulties encountered in the prior art.

Specifically, it is an object of the present invention to provide a packaged MMIC testing apparatus and method with means for performing a test without requiring soldering or bolting the circuit on the MMIC package onto the testing apparatus whereby the test is nondestructive and the test apparatus can be repetitively used.

Another object of the present invention is to provide a packaged MMIC testing apparatus and method wherein measurements of performance parameters can be more conveniently measured and the control means of the testing fixture is simple and convenient to use whereby the production process would not become too complicate and the production cost can be maintained at reasonably low level.

Another object of the present invention is to provide a packaged MMIC testing apparatus and method wherein measurements of performance parameters can be can be conducted directly whereby the losses caused by the testing apparatus can be minimized such that the performance characteristics of the packaged MMIC chips can be accurately measured.

Briefly, in a preferred embodiment, the present invention comprises an automated testing system for testing a packaged integrated circuit (IC) having a plurality of testing ports, each of the testing ports being used for connection with a testing interface assembly for further connection with external testing equipment. The automated test system comprises a testing platform including a plurality of guiding posts extending upwardly from the platform, each of the guiding posts further including a placement-shaped top surface forming a confining area. The test system further includes a frame-housing having a plurality of inter-connected walls, each of the walls further having an inner surface including an inner beam attached thereon, the inner surface and the inner beam defining an elongated vertical space corresponding to each of the guiding posts. Each of the walls near the inner beam further includes an access and attachment means having a plurality of openings allowing a testing probe on the testing interface assembly to penetrate through the inner beam and for securely attaching the testing interface assembly to the frame-housing. The automated test system further includes a control means which includes a testing computer and a test managing means for automatically and securely placing the packaged IC on the confining area. The managing means further automatically slides the frame-housing along the guiding posts fitting each of the elongated vertical spaces defined by the inner wall surfaces together with the inner beams thus positioning the testing probes on the testing interface assembly in securely engaging the testing ports to perform the test.

It is an advantage of the present invention that the it provides a packaged MMIC testing apparatus and method with means for performing a test without requiring soldering or bolting the circuit on the MMIC package onto the testing apparatus whereby the test is non-destructive and the test apparatus can be repetitively used.

Another advantage of the present invention is that it provides a packaged MMIC testing apparatus and method wherein :measurements of performance parameters can be more conveniently measured and the control means of the testing fixture is simple and convenient to use whereby the production process would not become too complicate and the production cost can be maintained at reasonably low level.

Another advantage of the present invention is that it provides a packaged MMIC testing apparatus and method wherein measurements of performance parameters can be conducted directly whereby the losses and phase errors caused by the testing apparatus can be minimized such that the performance characteristics of the packaged MMIC chips can be accurately measured.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1A:
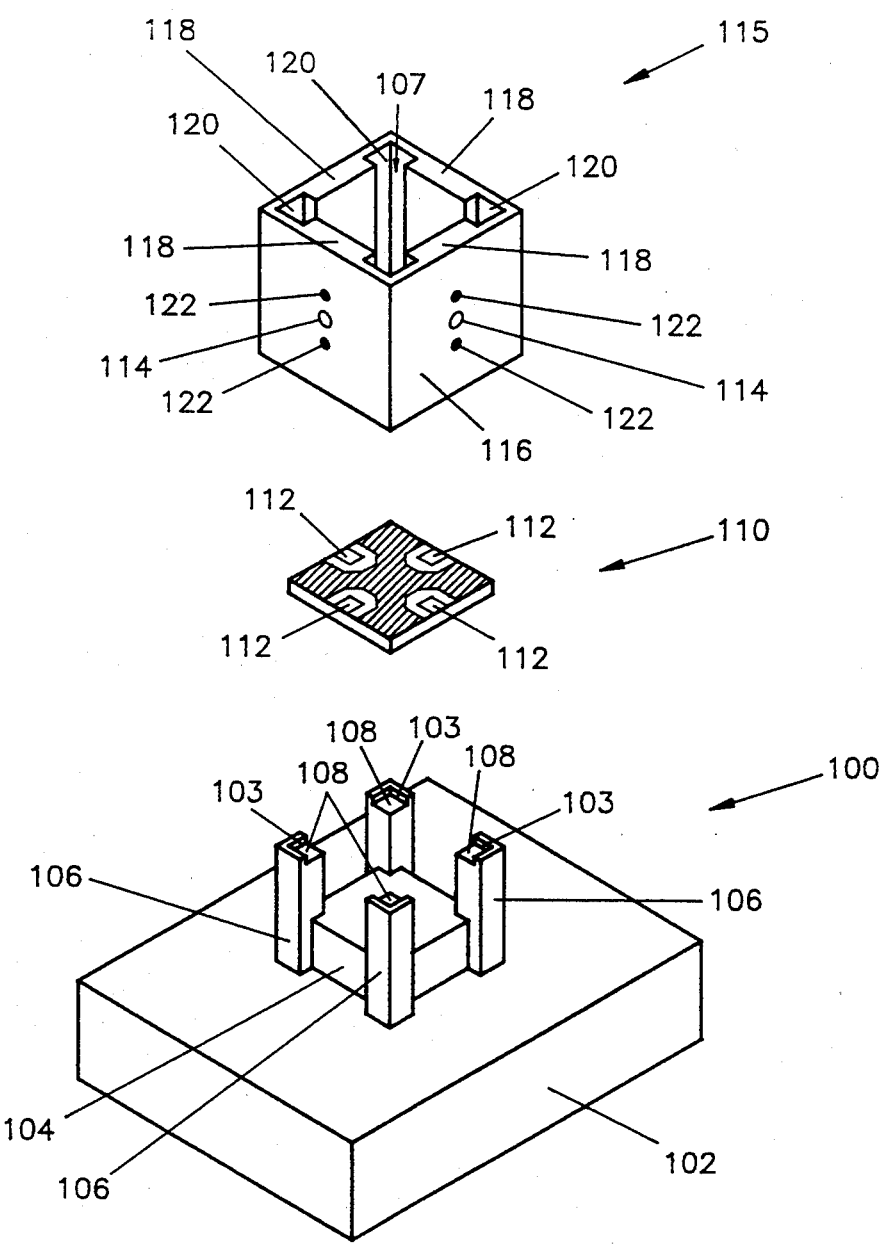
FIG. 1A is a perspective view of a testing apparatus showing separate components and the relative positions according to the present invention.
Figure 1B:
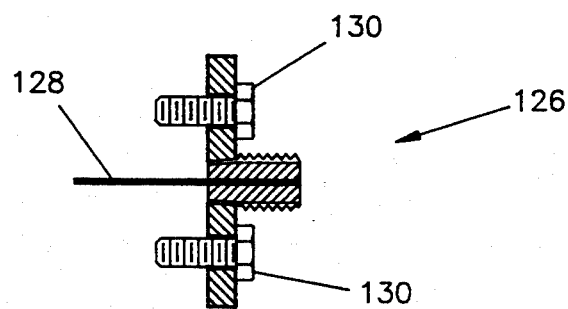
FIG. 1B is a side view showing a signal measuring assembly (SMA) which may be attached to a frame-housing of the apparatus of FIG. 1A.

FIG. 1A shows an apparatus the present invention wherein an apparatus for testing an MMIC package is shown, The apparatus is a testing fixture 100 includes a brass base 102 which has a testing platform 104 which is substantially square in shape wherein each of the four corners has a rectangular guiding post 106 fixed on the base 102 so that the testing platform 104 is also securely fixed on the base 102, The four guiding posts 106 each has two external edge surfaces 103 extended beyond the top surface 108 thus defining the top surface 108 as a confining testing area 108 whereon a MMIC package 110 with a MMIC Chip (not shown) disposed on the bottom surface of the package chip 110 is placed in the confining testing area 108 tightly fitting within the four posts 110, The four corners of the packaged MMIC is in direct contact with the confining test areas 108 on the top of the guiding post 106, The top surface of the MMIC package 110 has four test ports 112 which when placed on the test areas 108 on the top surface of the guiding post 106 is disposed between two guiding posts 106, The testing fixture 100 further includes a testing frame-housing 115 with four walls 116 each wall has a inner beam 118 on the center of the inner surface, Four walls 116 and four corresponding inner beams 118 thus defined four corner spaces 120 which then define a central enclosed testing volume 107, Each of these four corner space 120 has a dimension to allow a guiding post 106 to fit in the space 120 and tightly and securely bounded by the adjacent two walls and two inner beams tightly, The inner surface of the inner beams 118 is also disposed at very close distance from the edges of the MMIC package 110. Each of the inner beams 118 has a plurality of threaded bores 122 extending through the wall 116 all the way to the outside surface of the walls. FIG. 1B shows a side view of a signal measuring assembly (SMA) 126 securely attached to each of the four walls 116 by a plurality of bolts 130 tightly screwed into the threaded bores 122, Each of the SMAs has a testing probe 128 extending inwardly from the middle portion of the SMA 126 via a probe access bore 114 to the inner surface of the inner beam 118.

The MMIC tests are performed by lowering the frame-housing 115 onto the four guiding posts 106, fitting the four guiding posts into the fours corner space 120. The frame-housing is pressed down thus forcing the testing probes 128 tightly engaging the four testing ports 112. The MMIC test apparatus 100 may further have a locking means (not shown) to engage tightly on walls 116 when the frame-housing 115 is pressed with force thus securely locking the frame-housing 115 and asserting a predetermined force on the testing probes 128 onto the testing ports 112 of the MMIC package 110. Good contacts between the testing probes 128 and the testing ports 112 are established and maintained by utilizing the locking means to press down the frame-housing 115 onto the MMIC package 110.

Figure 2:
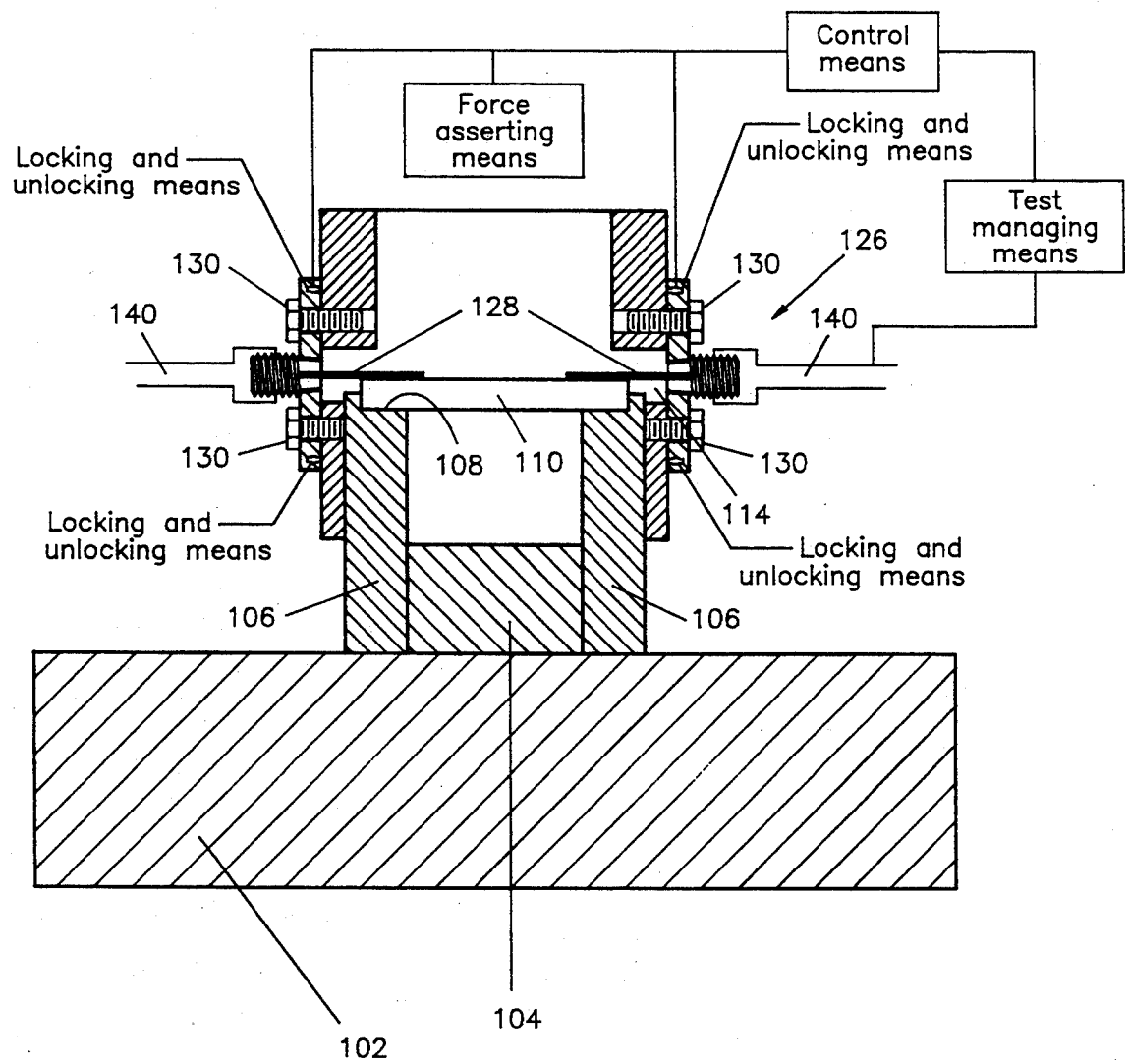
FIG. 2 is the side cross-sectional view of the testing apparatus of FIGS. 1 when packaged MMIC tests are being performed.

FIG. 2 shows a side view of the testing fixture 100 at the time when MMIC tests are being performed. The frame-housing 115 is pressed down onto the MMIC package 110 and is securely locked onto the test platform 102 by the use of a locking means. The SMAs 126 are further connected to the co-axial cables 140 wherein RF signals and DC power are to be applied for performing the MMIC tests.

The testing probes 128 of the SMA 126 are now in direct contact with the testing port 112 of the MMIC package. There is no need for a PC board with microstrips. The transition loss and the loss across the microstrips are thus eliminated. The MMIC characteristics as a function of the frequency can therefore be directly measured with high degree of accuracy.

In the present invention, the MMIC package can be mounted and the testing fixture 100 can be ready to perform the test in a few seconds without requiring bolting operation. The process involves few simple steps including: (1). placing the MMIC package on the testing platform 102, (2) fitting the frame-housing along the guiding posts, and (3) securely locking it to the testing platform 102. After the test is completed, the MMIC package can be quickly removed by unlocking the locking and unlocking means as shown in FIG. 2 and by removing the frame-housing 115 from the testing platform 102.

Therefore, by utilizing the testing fixture 100, the testing procedures are greatly simplified with much reduced time for testing while more direct and accurate test results are obtained. The difficulties encountered in the prior art are thus resolved by the testing apparatus and method according to the present invention.

By the use this simplified procedure, the test of the MMIC package 110 can be automated in a production line under the control of a computer. The placement of the MMIC package 110 and the lowering of the framing house 115 onto the test platform 104 along with the SMAs 126 can be precisely controlled by a computer to accurately press the testing probe 128 onto the testing ports 112 with a pre-determined force. The productivity of MMIC package can therefore be greatly increased with the testing procedure automated under the control of a computer.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. An apparatus for testing a packaged integrated circuit (IC) having a plurality of testing ports, each of said testing ports being used for connection with a testing interface assembly for further connection with external testing equipment, comprising:

a testing platform including a plurality of guiding posts extending upwardly from said platform, each of said guiding posts further including a placement-shaped top surface forming a confining area for securely and placement of said packaged IC thereon;

a frame-housing having a plurality of inter-connected walls, each of said walls further having an inner surface including an inner beam attached thereon, said inner surface and said inner beam defining an elongated vertical space corresponding to each of said guiding posts;

each of said walls on said inner beam further including an access and attachment means having a plurality of openings allowing a testing probe on said testing interface assembly to penetrate through said inner beam and for securely attaching said testing interface assembly to said frame-housing; and said frame-housing being guided to slide along said guiding posts fitting each of said elongated vertical spaces defined by said inner wall surfaces together with said inner beams thus moving and positioning said testing probes on said testing interface assembly together with said frame housing in securely engaging said testing ports to perform said test.

2. The apparatus for testing a packaged integrated circuit (IC) of claim 1 wherein:

said guiding posts each includes two external edge surfaces extending beyond a top surface of said guiding posts thus defining said placement-shaped top surface as a confining testing area for placing said packaged IC thereon.

3. The apparatus for testing a packaged integrated circuit (IC) of claim 1 further comprises:

a force asserting means for asserting a downward force to said frame-housing to engage said testing probes with a predetermined force onto said testing ports in performing said test.

4. The apparatus for testing a packaged integrated circuit (IC) of claim 3 further comprises:

a locking and unlocking means for securely locking said frame-housing to said testing platform during the performance of said test and for unlocking said frame-housing to said testing platform after said test is completed.

5. The apparatus for testing a packaged integrated circuit (IC) of claim 4 further comprises:

control means for controlling said force asserting means for asserting a predetermined downward force and said controlling means further controls said locking and unlocking means for performing said locking and unlocking operations.

6. An automated testing system for testing a packaged integrated circuit (IC) having a plurality of testing ports, each of said testing ports being used for connection with a testing interface assembly for further connection with external testing equipment, comprising:

a testing platform including a plurality of guiding posts extending upwardly from said platform, each of said guiding posts further including a placement-shaped top surface forming a confining area;

a frame-housing having a plurality of inter-connected walls, each of said walls further having an inner surface including an inner beam attached thereon, said inner surface and said inner beam defining an elongated vertical space corresponding to each of said guiding posts;

each of said walls near said inner beam further including an access and attachment means having a plurality of openings allowing a testing probe on said testing interface assembly to penetrate through said inner beam and for securely attaching said testing interface assembly to said frame-housing; and a control means including a testing computer and a test managing means for automatically and securely placing said packaged IC on said confining area, said managing means further automatically sliding and guiding said frame-housing along said guiding posts fitting each of said elongated vertical spaces defined by said inner wall surfaces together with said inner beams thus moving and positioning said testing probes on said testing interface assembly together with said frame housing in securely engaging said testing ports to perform said test.

7. The automated testing system of claim 6 wherein said test managing means further includes:

a force asserting means for asserting a downward force to said frame-housing to engage said testing probes with a predetermined force onto said testing ports in performing said test; and a locking and unlocking means for securely locking said frame-housing to said testing platform during the performance of said test and for unlocking said frame-housing to said testing platform after said test is completed.

8. The automated testing system of claim 7 further includes:

a test monitoring means for monitoring the performance of said test; and said test managing means further receives monitoring data from said test monitoring means as a feedback data for controlling the performance of said test.

9. The automated testing system of claim 8 further includes:

a test display means for receiving and displaying said monitoring data from said test monitoring means.

10. The automated testing system of claim 9 wherein:

said test computer is further connected to said external test equipment for receiving and analyzing a plurality of test data from said external test equipment.

11. A method for testing a packaged integrated circuit (IC) having a plurality of testing ports, each of said testing ports being used for connection with a testing interface assembly for further connection with external testing equipment, comprising the steps of:

(a) providing a confining area for securely placing said packaged IC thereon by utilizing a placement-shaped top surface of a plurality of guiding posts extending upwardly from a test platform;

(b) providing a frame-housing having a plurality of inter-connected walls, each of said walls further having an inner surface including an inner beam attached thereon, said inner surface and said inner beam defining an elongated vertical space corresponding to each of said guiding posts;

(c) utilizing a testing probe on said testing interface assembly to penetrate through said inner beam and for securely attaching said testing interface assembly to said frame-housing; and (d) sliding and guiding said frame-housing along said guiding posts fitting each of said elongated vertical spaces defined by said inner wall surfaces together with said inner beams thus moving and positioning said testing probes on said testing interface assembly together with said frame-housing to securely engage onto said testing ports to perform said test.

12. The method for testing a packaged integrated circuit (IC) as recited in claim 11 further comprises a step of:

(e) controlling said placement of said packaged IC in said confining area in step (a) and said sliding operation of said frame-housing along said guiding posts in step (d) by utilizing a computer control means.

* * * * *